United States Patent [19]

Tamai et al.

[11] 4,381,601
[45] May 3, 1983

[54] APPARATUS FOR MOUNTING ELECTRONIC COMPONENTS

[75] Inventors: Kouichi Tamai; Masao Tanaka, both of Yokohama, Japan

[73] Assignee: Tokyo Shibaura Denki Kabushiki Kaisha, Kawasaki, Japan

[21] Appl. No.: 277,013

[22] Filed: Jun. 24, 1981

Related U.S. Application Data

[62] Division of Ser. No. 91,756, Nov. 6, 1979, abandoned.

[30] Foreign Application Priority Data

Nov. 9, 1978 [JP] Japan .............................. 53-138506
Nov. 9, 1978 [JP] Japan .............................. 53-138508

[51] Int. Cl.³ .................................................. B23P 19/04
[52] U.S. Cl. ........................................... 29/740; 29/743; 29/759; 29/834; 118/243; 118/503; 156/299; 156/303; 156/552; 414/226; 414/753
[58] Field of Search ................. 29/740, 743, 759, 834, 29/840; 118/503, 243, 263; 156/578, 552, 299, 303; 414/226, 750, 751, 752, 627, 737, 744 B; 228/6 A, 49 R; 294/64 R

[56] References Cited

U.S. PATENT DOCUMENTS

| | | | |
|---|---|---|---|
| 2,782,756 | 2/1957 | Hunt | 118/243 |
| 3,010,427 | 11/1961 | Hautau | 118/243 |
| 3,651,957 | 3/1972 | Ball et al. | 294/64 R |
| 3,918,144 | 11/1975 | Mimata et al. | 228/6 A X |
| 4,135,630 | 1/1979 | Snyder et al. | 29/740 X |

Primary Examiner—Carl E. Hall
Assistant Examiner—P. W. Echols
Attorney, Agent, or Firm—Cushman, Darby & Cushman

[57] ABSTRACT

Disclosed is a method for mounting electronic components comprising steps of sucking an electronic component such as semiconductor pellet to the tip end of an attraction nozzle, holding and automatically orienting the sucked electronic component by means of a plurality of arms arranged along the outer periphery of the tip end of the sucking nozzle, transferring the held electronic component to a predetermined bonding portion of a semiconductor device substrate such as stem, and opening the arms to bring down the electronic component onto the predetermined bonding portion for bonding. Also disclosed is an apparatus for executing this method.

2 Claims, 8 Drawing Figures

APPARATUS FOR MOUNTING ELECTRONIC COMPONENTS

This is a division of application Ser. No. 91,756 filed Nov. 6, 1979 now abandoned.

This invention relates to a method and an apparatus for mounting a fine electronic component, such as a semiconductor chip or a surface-wave element, on an electronic device substrate, such as a stem or a lead frame.

In a prior art method for mounting the electronic component of this type, e.g. semiconductor chip, as shown in FIG. 1, a semiconductor pellet 1 cut out from a wafer and brought to a pickup position A by an X-Y-direction travelling table (not shown) is transferred to a locating position B by a first pickup tool 2, held by locating plates 3 on both sides of the locating position B to be oriented and further transferred to a mounting position C of a stem or lead frame 5 by a second pickup tool 4.

In another prior art method omitting the locating position B, a collet 6 is used for the pickup tool, as shown in FIG. 2. In this case, the pellet 1 is attracted by vacuum to a tapered surface 7 along the inner periphery of the pipe of the collet 6, and transferred as it is.

These prior art methods, however, are subject to the following defects.

Namely, the method employing the first and second pickup tools 2 and 4 separately requires the locating position B for the pellet 1, so that the apparatus would be complicated, and the pattern surface of the pellet 1 would be damaged greatly by the repeated contacts of the first and second pickup tools 2 and 4 with the pattern surface. Moreover, according to the method, the tip end of the second pickup tool 4 transfers the oriented pellet 1 flat, so that acceleration of the indexing for the whole apparatus may possibly lead to a position shift of the pellet 1 due to internal force or may fail to pick up pellet 1 entirely. Thus, with regards to large-sized pellets, the orienting accuracy for the mounting on the stem or lead frame 5 would be poor.

Further, according to the prior mounting method employing the collet 6, the pellet 1 is oriented on the tapered surface 7 inside the collet 6, so that Au(Au-Si eutectic mounting method), solder (Solder-mounting method) or adhesive (dispenser method, stumping mounting method) may possibly stick to the tip end of the collet 6, finally sticking to a subsequent pellet 1 to cause trouble. If a pellet 1 with a thickness of t is attracted by using the collet 6, for example, then the height of the tip end of the collet 6 above the stem or lead frame 5 will be t/2, so that the adhesive on the stem or lead frame 5 will most probably stick to the tip end of the collet 6. In addition, such orientation adjustment by means of the collet 6 may be applied to square or rectangular pellets 1, but it cannot be applied to pellets of other shapes, such as rhomboid.

This invention has been accomplished in view of the above-mentioned circumstances, and is intended to provide a method and apparatus for mounting electronic components, capable of improving the accuracy in mounting fine electronic components on device substrates, and of simplification and speed-up of the construction and operation of the apparatus without involving any substantial possibility of damaging the electronic components during mounting operations.

According to this invention, there is provided a method for mounting electronic components, comprising steps of sucking an electronic component on the tip end of a suction nozzle, holding the sucked electronic component by means of a plurality of arms arranged along the periphery of the tip end of the suction nozzle and automatically orienting the component, transferring the electronic component to a predetermined bonding portion of a semiconductor device substrate; and opening said arms to bring down the electronic component to band it onto the predetermined bonding portion.

Further, according to this invention, there is provided a mounting head for an electronic component comprising, a pillarlike block having a center hole and two pairs of grooves formed parallel to the length of the center hole in the peripheral wall surface of the block, a contacting block having a bore which communicates with the center hole of said pillarlike block, the distal end of which has substantially the same external plane dimensions as those of the electronic component, and the proximal end of which is attached to the bottom of the pillarlike block, two pairs of locating arms fitted in the grooves and capable of rocking around the substantially middle point thereof toward the center hole, the tip ends of said locating arms protruding beyond the distal end of the contacting block to form a semiconductor chip holding section capable of opening and closing as required, a pickup means slidably fitted in center hole and the bore, and protruding from the contacting block to abut and attract the electronic component, and a locating arm driving means for opening and closing the locating arms as required.

Furthermore, according to this invention, there is provided a mounting apparatus for electronic components comprising the above-mentioned mounting head and an adhesive applying device.

This invention can be more fully understood from the following detailed description when taken in conjunction with the accompanying drawings, in which.

Now there will be described an embodiment of this invention with reference to the accompanying drawings.

Figure 3:
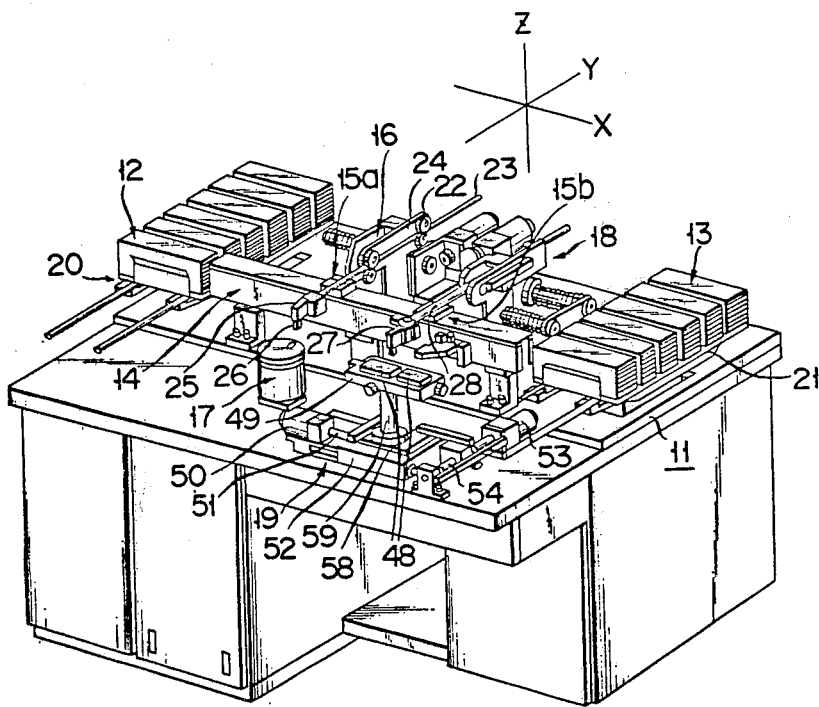
FIG. 3 is a general perspective view of a mounting apparatus for electronic components according to this invention.

FIG. 3 shows a general view of the mounting apparatus for electronic components according to this invention. This apparatus comprises a feed mechanism 14 interposed between a plurality of loading magazines 12 on one side of a table 11 and a plurality of unloading magazines 13 on the other side, locating devices 15a and 15b disposed respectively in first and second positions of the feed mechanism 14, an adhesive applicator 16 disposed correspondingly to the first position of the feed mechanism 14, an adhesive thickness leveller 17 at the forward end portion of the applicator 16, a mounting mechanism 18 disposed correspondingly to the second position of the feed mechanism 14, and an X-Y-direction shifting device 19 at the forward end portion of the mounting mechanism 18.

The loading and unloading magazines 12 and 13 store in multistages carrier tapes each containing a plurality of stems arranged at regular intervals. On both inner walls of each magazine 12 or 13, there are formed a plurality of grooves in which both side portions of the carrier tapes are fitted. Further, the loading and unloading magazines 12 and 13 on the two sides of the table 11 are intermittently moved enbloc in Y and Z directions by travelling tables 20 and 21 which carry these magazines 12 and 13, respectively. Thus, the several carrier tape storing stages inside the loading magazines may be successively caused to face the supply-side end portion of the feed mechanism 14, while the vacant stages of the unloading magazines are allowed to be successively intermittently brought to the position facing the takeout-side end portion of the feed mechanism 14.

The feed mechanism 14 is so constructed that a feed pin supported by a feed rod is repeatedly advanced, lowered, withdrawn and raised by a cam mechanism. Thus, the carrier tapes are caught by the feed pin, and are intermittently transferred from the supply-side end portion to the first position, from the first position to the second position, and from the second position to the takeout-side end portion.

Moreover, the adhesive applicator 16 in the first position includes a rod 23 which can be advanced and retreated by means of paired support rollers 22 mounted on the upper portion of a vertically movable T-shaped base plate 24. The rod 23 is moved back and forth, and the base plate 24 is moved up and down by using a cam (not shown). Further, a head 25 at the forward end of the rod 23 is moved back and forth between the locating device 15a in the first position and the adhesive thickness leveller 17, as well as in the vertical direction. By doing this, the adhesive inside the thickness leveller 17 is torn off by means of a stump tool 26 attached to the bottom of the head 25, and is applied to the top surface of a stem 5 which is located and settled in the first position.

Figure 1:
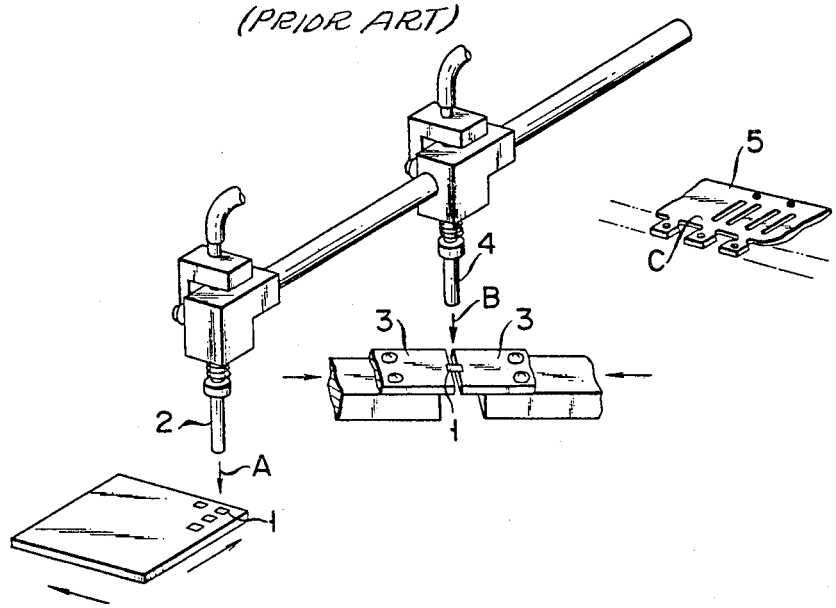
FIG. 1 is a perspective view of the essential parts of a mounting apparatus for illustrating a prior art method for mounting semiconductor chips.
Figure 4:
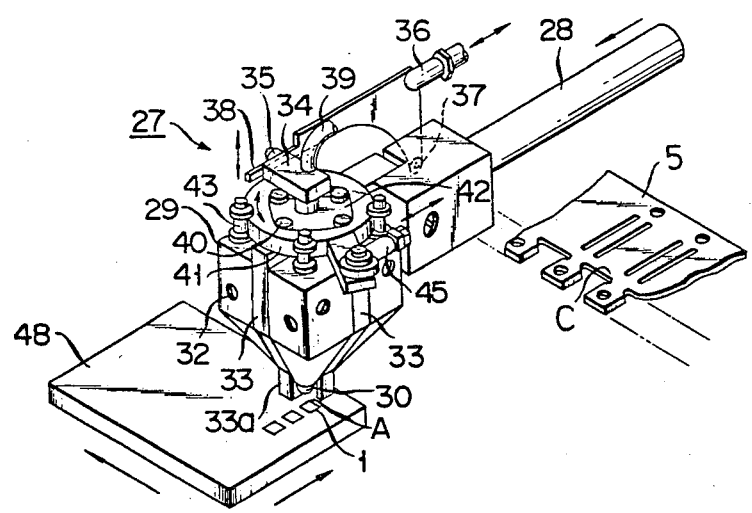
FIG. 4 is a perspective view chiefly showing a mounting head for electronic components according to this invention.
Figure 2:
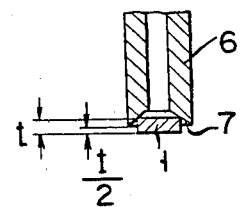
FIG. 2 is a sectional view of the essential parts of the apparatus of FIG. 1 for illustrating the prior art method for mounting semiconductor chips.

Referring now to the drawings of FIGS. 4 to 6, there will be described the mounting mechanism 18 in the second position.

A mounting head 27 is attached to the forward end of a rod 28 which is rectilinearly advanced and retreated and also moved up and down in a level posture by means of a cam mechanism (not shown) or the like.

The mounting head 27 includes a cylindrical pickup tool 30 which is vertically movably fitted in a center hole of a pillarlike block 29. The pillarlike block 29 is provided on the four sides thereof with grooves 31, in which locating arms 33 capable of rocking around their corresponding shafts 32 in the middle thereof are fitted respectively. Further, the pickup tool 30 is so designed as to be driven in the vertical direction by a lever 38 which is disposed below a roller 35 of a mounting plate 34 at the top of tool 30. A control section 36 is moved back and forth by means of a cam mechanism (not shown) so as to vertically rock said lever 38 around a shaft 37. The upper end of the pickup tool 30 is connected with a vacuum hose 39 of a vacuum-pressure source, while the lower end is formed flat. The respective upper ends of the four locating arms 33 are fitted with rollers 40, and are fitted in an inside bore 42 of a ring-shaped locating cam 41. The locating cam 41, having its circular outside peripheral edge engaged with rollers 43 which protrude from the four corners of the top of the pillarlike block 29, is allowed to rock as indicated by the arrow of FIG. 4. The inside bore 42 has a substantially square flat shape. Further, a compression coil spring 44 is embedded in an upper portion of each groove 31 of the pillarlike block 29, urging the upper portion of each locating arm 33 outward. Thus, the rollers 40 are pressed against the inside peripheral surface of the inside bore 42.

Accordingly, when the locating cam 41 is so rocked as to locate the four rollers 40 in the four corner portions of the inside bore 42, the bottom portions of the locating arms 33 are brought close to one another and closed. When the locating cam 41 is so rotated as to locate the four rollers 40 in the four side portions of the inside bore 42, on the other hand, the bottom portions of the locating arms 33 are separated from one another to be opened.

The rocking of the locating cam 41 cam be achieved by moving a control section 45 by means of a cam mechanism (not shown) or the like.

Attached to the bottom of the pillarlike block 29 is a contacting block 46 the flat bottom of which has substantially the same external dimensions as those of pellet 1. The bottom end of the contacting block 46 is somewhat recessed from the bottom or tip ends of the locating arms 33. Bored through the center of the block 46 is a passage hole 47 communicating the center hole of the pillarlike block 29 and allowing the pickup tool 30 to slide therein.

The contacting block 46 maintains the level posture of the chip 1 which is attracted to the pickup tool 30, and serves also as a stopper for the closing action of the locating arms 33.

Figure 5A:
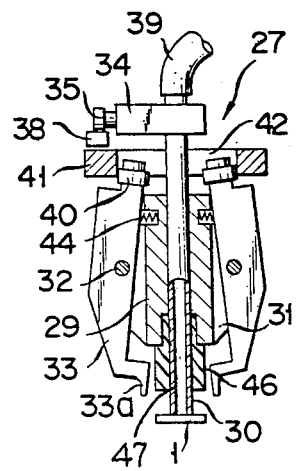
FIGS. 5A to 5C are sectional views showing in sequence the operations of the mounting head of this invention.
Figure 5B:
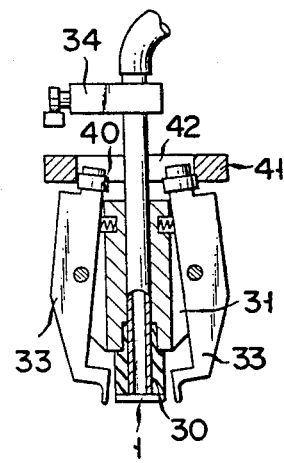
Figure 5C:
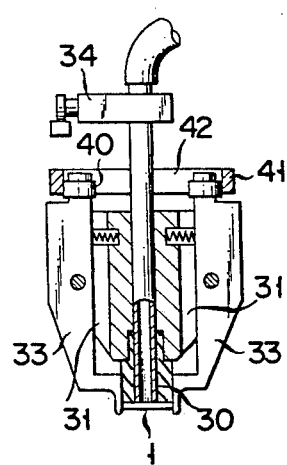

Now there will be described the operation of the mounting head. First, a pellet tray 48 as mentioned later is carried on a table 49 of the X-Y-direction shifting device 19, and transferred to a pickup position A. Then, the pickup tool 30 is lowered, and the pellet 1 is attracted to the bottom of the pickup tool 30 by the vacuum power of the vacuum pressure source (not shown). Thereafter, by raising the pickup tool 30 with the pellet 1 attracted thereto and rotating the locating cam 41, the pellet 1 is so located as to be enclosed on the bottom surface of the contacting block 46 by bottom portions 33a of the locating arms 33. Here the external dimensions of the contacting block 46 are substantially the same as those of the pellet 1, and the pellet 1 will never be subjected to any undue force since the bottom portions 33a of the locating arms 33, when closed, are caused to abut against the sides of the contacting block 46. Then, the rod 28 is moved to carry the pellet 1 to a mounting position C while the pellet 1 is located as it is, the locating arms 33 are opened, and the pickup tool 30 is lowered. Then, the pellet 1 is pressed against the adhesive-coated surface of the stem 5 which is settled in the position C by the locating device 15b, and thus the mounting operation is completed. FIGS. 5A to 5C illustrate these steps of operation, one cycle from pickup to mounting covering a sequence, FIG. 5A, FIG. 5B, FIG. 5C, FIG. 5B, FIG. 5A.

Figure 6:
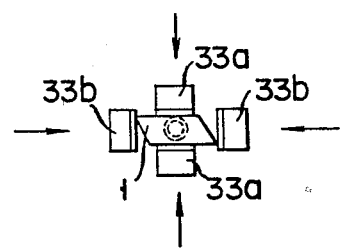
FIG. 6 is a plan view for illustrating the operation of the tips of locating arms of the mounting head of this invention.

By optionally changing the configuration of the inside peripheral surface of the ring-shaped locating cam 41, moreover, the drive of the four locating arms 33 can be made sequential; the operation of one facing pair of locating arms 33b may be delayed relatively to the operation of the other facing pair of locating arms 33a, as shown in FIG. 6. Thus, by providing such driving sequence, the locating arms 33a and 33b may smoothly be brought in contact with even a rhomboidal pellet 1, enabling accurate location without applying any unreasonable force to the pellet 1.

The X-Y-direction shifting device 19 turns an X-axis feed screw 51 by means of an X-axis pulse motor 50 to immove an X-axis table 52 fitted with the screw 51, and turns a Y-axis feed screw 54 by means of a Y-axis pulse motor 53 to move a Y-axis table 58. Further, the shifting device 19 intermittently moves the pellet tray fixing table 49 on a support 59 which is erected on the Y-axis table 58 and the pellet tray 48 fixed on the table 49 in the X- and Y-directions, thereby locating one to be picked up among a number of pellets 1 arranged along the X-Y directions in the pickup position A.

Now there will be described the operation of the mounting apparatus as a whole.

The carrier tapes in the loading magazines 12 are intermittently fed to the first and second positions by the feed mechanism 14. In the first position, the adhesive which is levelled to a regular thickness by the adhesive leveller 17 is torn off and applied to the top surface of the stem 5 of each carrier tape by means of the adhesive applicator 16. In the second position, the pellet 1 is mounted on the adhesive-coated surface of the stem 5 by the mounting mechanism 18, and thus the pellet bonding operation is finished. In the first and second positions, the stem 5 is fixed in an accurate position by the locating devices 15a and 15b. The carrier tape, storing the stem 5 with the pellet 1 thus bonded thereto, is delivered to one of the unloading magazines 13 by the feed mechanism 14, and stored in the same.

According to the invention, as described above, an adhesive with a uniform thickness is torn off and applied to a substrate such as a stem or lead frame fixed in place, and an electronic component is mounted on the adhesive-coated surface of the substrate, so that the electronic component may be bonded to the lower member with high accuracy and improved strength, obviating the problem of intense heat which is involved in the prior art Au-Si eutectic method or solder mounting method, and preventing the uneven adhesive discharge or reduction in bonding strength due to repeated discharge that is peculiar to the prior art adhesive discharge method employing a dispenser.

Moreover, according to this invention, an electronic component is attracted by a pickup tool of a mounting head, held and located by a plurality of locating arms surrounding the pickup tool, and mounted on the adhesive-coated surface of a device substrate. Accordingly, the electronic component may be mounted on the device substrate with improved accuracy, and the possibility of damaging the electronic component will be reduced. Further, the electronic component is oriented in the feeding process without requiring a separate conventional locating device, so that the whole body of the apparatus is surrounded by a large free space, thus, providing ease of maintenance. Furthermore, since the electronic component is held and located by the plurality of locating arms surrounding the pickup tool, there may be provided various advantages; elimination of mistakes in pickup, speed-up in the operation of the apparatus as a whole, improved mounting accuracy to enable elimination of additional locating devices for a wire bonder, etc. for the subsequent processes, improvement of semiconductor devices in quality, etc.

Additionally, by providing a driving sequence for the plurality of locating arms according to the configuration of the upper member, an electronic component of e.g. rhomboid shape may duly be located with accuracy.

This invention may be applied not only to the manufacture of semiconductor devices or surface-wave elements such as the bonding of the pellet to the stem, but also to a wide variety of fields including mounting of elements on liquid crystals and printed substrate.

What we claim is:

1. A mounting head for an electronic component, comprising:
   a pillarlike block having a center hole and two pairs of grooves formed parallel to the length of said center hole in the peripheral wall surface of said block;
   a contacting block having a bore which communicates with the center hole of said pillarlike block, the distal end of which has substantially the same external plane dimensions as those of the electronic component, and the proximal end of which is attached to the bottom of said pillarlike block;
   two pairs of locating arms fitted in said grooves and capable of rocking around the substantially middle point thereof toward said center hole, the tip ends of said locating arms protruding beyond the distal end of said contacting block to form a semiconductor chip holding section capable of opening and closing as required;
   a pickup means slidably fitted in the center hole and said bore, and protruding from said contacting block to abut and attract the electronic component; and
   a locating arm driving means for opening and closing the locating arms as required.

2. A mounting head according to claim 3, wherein said driving means has a ring-shaped plate with a substantially square inside bore, and is rotatably attached to the rear end of said pillarlike block, so that the rear end portions of said locating arms are pressed inward to open the tip ends of said locating arms when said rear end portions are caused to engage the four sides of said inside bore, and that said rear end portions are moved outward to close the tip ends of said locating arms when the four corner portions of said inside bore are brought to the positions of said rear end portions.

* * * * *